United States Patent [19]

Ravishankar

[11] Patent Number: 4,803,946
[45] Date of Patent: Feb. 14, 1989

[54] CONTINUOUS BULK DRAIN FOR PHOTORESIST

[75] Inventor: Gurumurthi Ravishankar, Chandler, Ariz.

[73] Assignee: Intel Corporation, Santa Clara, Calif.

[21] Appl. No.: 106,619

[22] Filed: Oct. 6, 1987

[51] Int. Cl.[4] .............................................. B11C 13/00
[52] U.S. Cl. ...................................... 118/52; 118/501; 222/585; 156/345
[58] Field of Search ....................... 210/171, 172, 167; 118/501, 31, 52, 54; 156/642, 345; 222/585

[56] References Cited

U.S. PATENT DOCUMENTS

| | | | |
|---|---|---|---|
| 809,891 | 1/1906 | Baldwin | 222/585 |
| 923,465 | 6/1909 | Trepanier | |
| 1,100,223 | 6/1914 | Butters | 210/411 X |

Primary Examiner—David L. Lacey
Assistant Examiner—Thi Dang
Attorney, Agent, or Firm—Blakely, Sokoloff, Taylor & Zafman

[57] ABSTRACT

A collection and draining system for use in a manufacturing process. This system comprises a collection tank coupled with a collector, the collector consisting of a funnel and a stem. The stem of the collector extends sufficiently into the collection tank such that the bottom of the stem is always covered with the solvent being collected during normal operations of the collection system. This is accomplished by locating the drain in the collection tank above the bottom of the stem. This results in reduced build up of solvents along the walls of the collection tank and the collector. In addition, by allowing the drain of the collection tank to drain into a main drain system, removal of the collection tank from a machine it is attached to during operation of the machine is unnecessary. Removal is only necessary during cleaning of the collection tank or the collector.

15 Claims, 5 Drawing Sheets

FIG_1
(PRIOR ART)
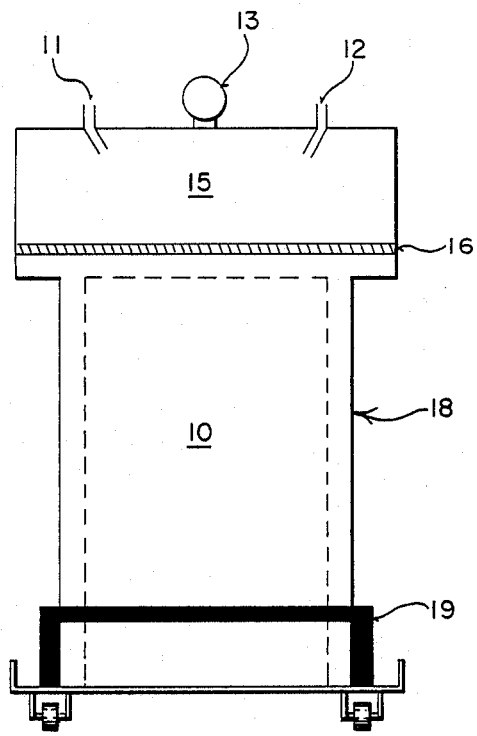
FIG_2
(PRIOR ART)
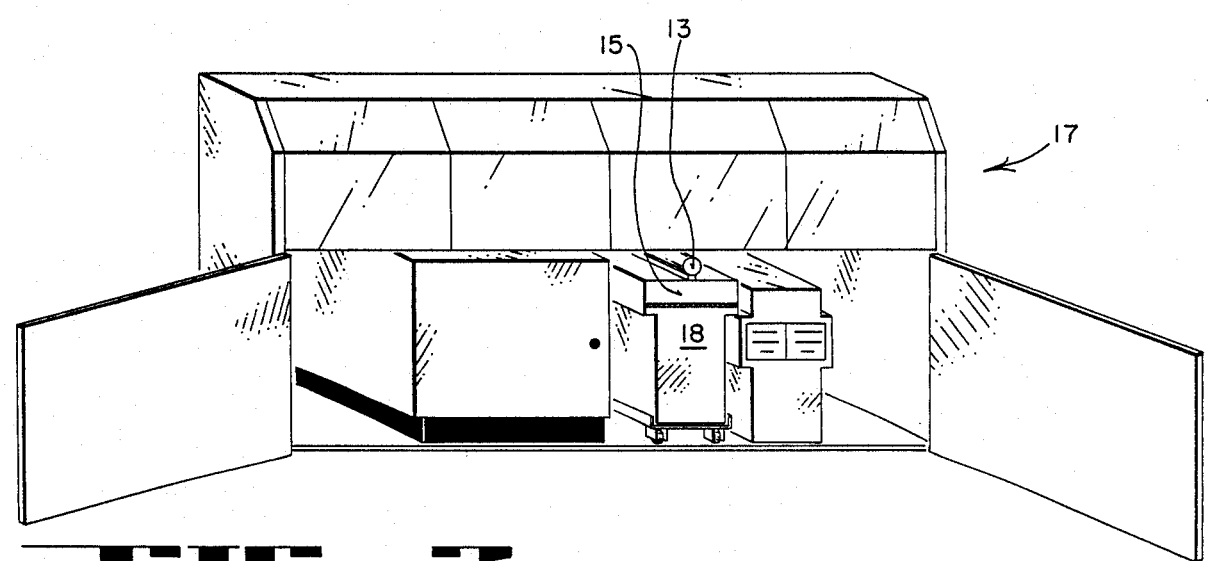

FIG_3
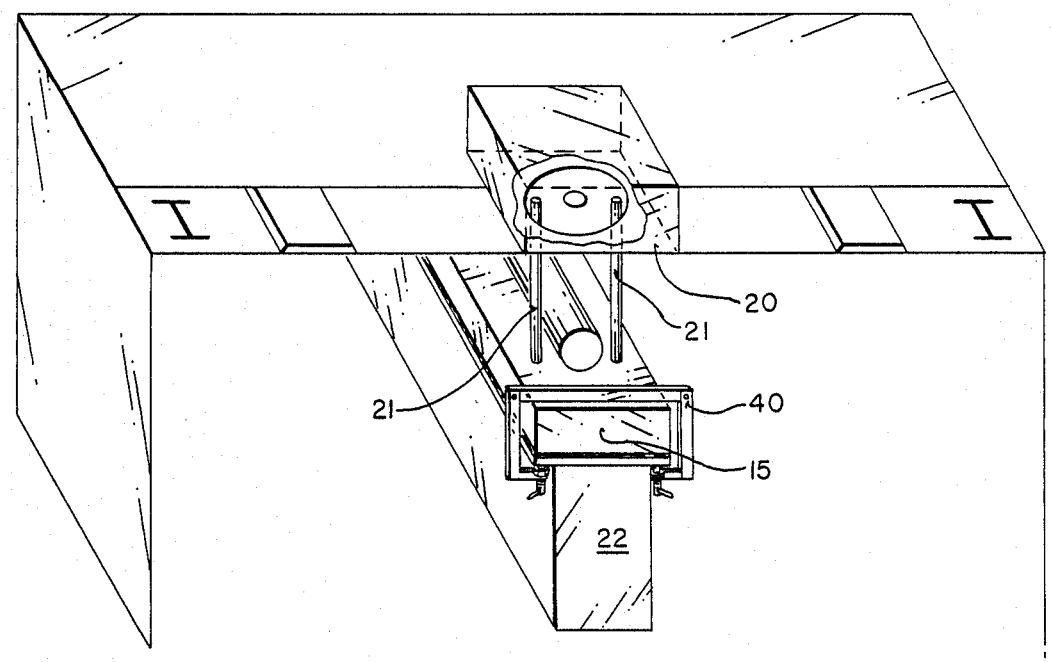
FIG_4
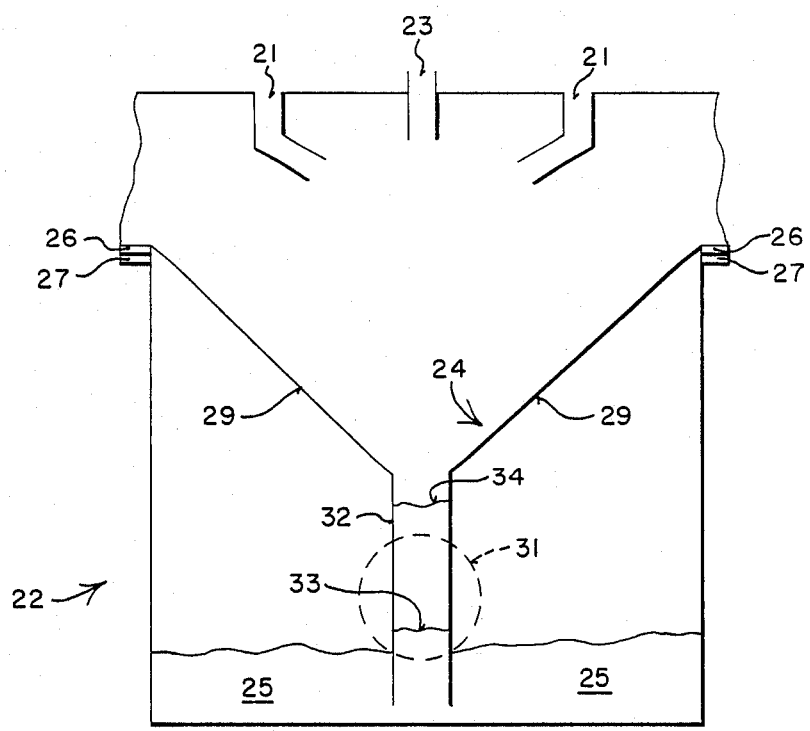

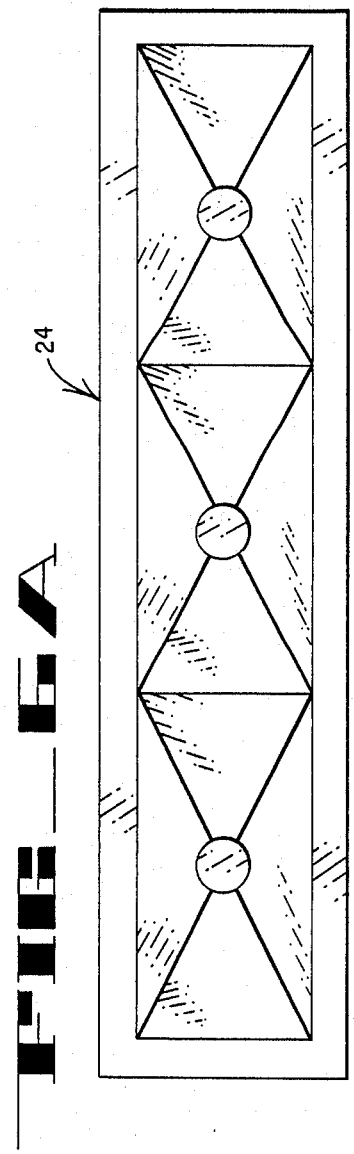
FIG_6A
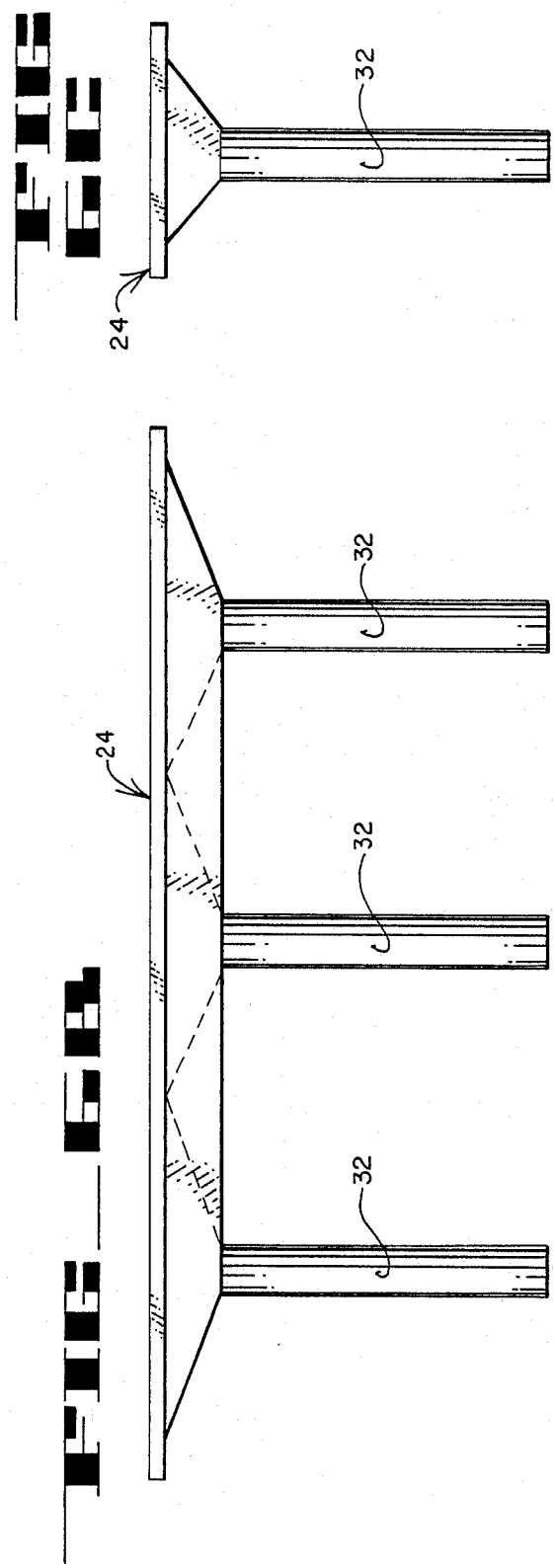
FIG_6C
FIG_6B

FIG_7
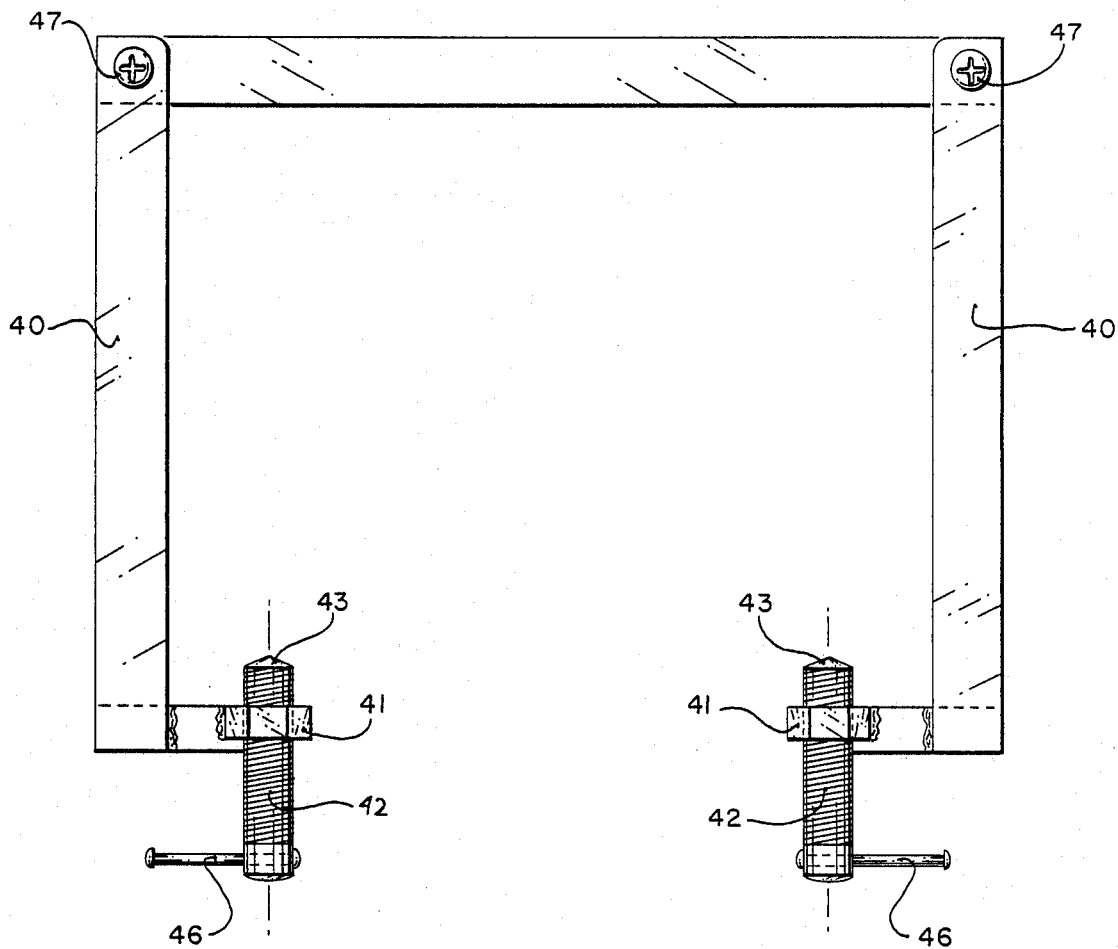
FIG_8
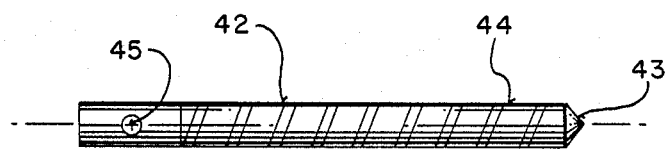

CONTINUOUS BULK DRAIN FOR PHOTORESIST

BACKGROUND OF THE INVENTION

1. Field of the Invention

This invention relates to the field of collection and disposal of waste chemicals during manufacturing.

2. Prior Art

In the field of collection and disposal of photoresist and/or other liquid material dispensed in spin chambers during the manufacture of semiconductors one known prior method of collecting and disposing of the photoresist or other liquid material is the use of a drain cart. The drain cart will be more fully described in connection with FIG. 1. Use of the drain cart requires the cart to be periodically manually disconnected from the spin chamber and cans for collecting the photoresist are required to be emptied. The cart and can assembly is then reassembled and mounted under the machine.

This poses several disadvantages. First, personnel are exposed to potentially hazardous chemicals and chemical vapors. Second, there is potential for contamination of the area around the machine. Third, the use of the drain cart results in significant down time of the machine while the drain cart is being emptied. Fourth, there is significant wear and tear on the mechanical parts of the drain cart which results in frequent mechanical malfunction of the machine.

SUMMARY OF THE INVENTION

The present invention discloses a continuous drain system for collecting photoresist and other solvents from spin chambers during semiconductor manufacturing. The design of the present invention greatly reduces the exposure of personnel to potentially hazardous chemicals and vapors, offers continuous draining of the machines, requires little or no maintenance once installed, significantly improves cleanliness of the area, and results in a significant increase in the effective operating time of the machine.

The collection and draining system consists of a collection tank which is coupled with a main drain system. The collection tank is coupled with a liquid collector apparatus which consists of one or more funnel-like devices. These funnel-like devices sit in the collection tank and the photoresist drains from the spin chamber through the funnel-like devices into the collection tank. The system is designed such that the main drain plug which couples the collection tank with the drain system is above the level of the bottom of the stem. Thus, when the system is operational photoresist will always cover at least the bottom of the stem of the collector. This system results in reduced build-up of dried resist on the walls of the collection tank and of the collector and allows continuous draining of the photoresist.

BRIEF DESCRIPTION OF THE DRAWINGS

FIG. 1 illustrates a prior art drain cart.

FIG. 2 illustrates a prior art drain cart and resist coater machine.

FIG. 3 illustrates a collection tank installed in a resist coater machine as may be utilized by the present invention.

FIG. 4 is a cross sectional view of the collection tank and a liquid collector as may be utilized by the present invention.

FIG. 6(a) illustrates a top view of the liquid collector as may be utilized by the present invention.

FIG. 6(b) illustrates a side view of the liquid collector as may be utilized by the present invention.

FIG. 6(c) illustrates an end view of the liquid collector as may be utilized by the present invention.

FIG. 7 illustrates a clamping system as may be utilized by the present invention.

FIG. 8 illustrates a screw as may be utilized by the clamping system of the present invention.

DETAILED DESCRIPTION OF THE PRESENT INVENTION

Figure 5C:
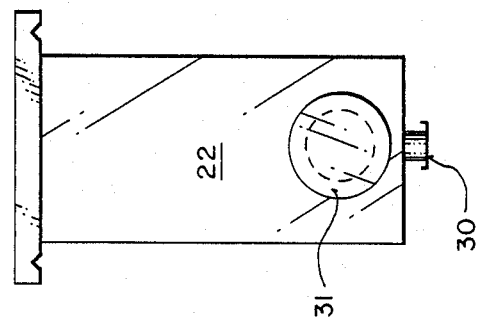
FIG. 5(c) illustrates an end view of the collection tank as may be utilized by the present invention.

A drainage and collection system for collection for photoresist and other solvents is described. In the following description, numerous specific details are set forth such as types of material, dimensions, etc., in order to provide a thorough understanding of the present invention. It will be obvious, however, to one skilled in the art that the present invention may be practiced without these specific details. In other instances, well known structures have not been shown in detail in order not to unnecessarily obscure the present invention.

DESCRIPTION OF THE PRIOR ART

The manufacture of semiconductor wafers results in certain solvents as waste products. Machinery and equipment used in the manufacture of wafers typically provides for collection of the solvents and allows for their disposal.

An example of this equipment is a positive resist coater manufactured by Semiconductor Systems, Inc. of San Jose, Calif. This positive resist coater provides a drain cart 18 as illustrated by FIG. 1. The drain cart 18 is coupled with the resist coater by means of a gasket 16. The gasket 16 provides an air tight seal between the drain cart 18 and the machine manifold 15 of the resist coater. Resist from the spin chamber of the resist coater is allowed to drain through the resist openings 11 and 12 and drains into the drain tank 10. Exhaust is allowed to escape through exhaust manifold 13. When the drain tank 10 begins to fill, the drain cart 18 is disconnected from the resist coater and is pulled away by use of the handle 19. The drain cart 18 is then moved to a location where the resist may be disposed of. After the drain tank 10 is emptied the cart 18 is then moved back in place in the resist coater. During normal operations of the resist coater this removal and draining of the drain tank 10 may occur as often as every half hour. This system results in significant down time of the resist coater, exposure of personnel to potentially hazardous chemicals and chemical vapors, wear and tear on the drain cart 18 and manifold 15 is due to frequent disconnection and reconnection at the gasket 16 and potential for the manufacturing area to become contaminated.

FIG. 2 illustrates the drain cart 18 installed in a positive resist coater 17.

DESCRIPTION OF THE PRESENT INVENTION

As illustrated by FIG. 4, the present invention comprises a collection tank 22 and liquid collector 24. The collection tank 22 is coupled with the collector 24 by means of a gasket 27. This gasket 27 is comprised of silicon rubber, however, any other material that may function as a gasket may be utilized without departing from the spirit of the present invention so long as the material will not dissolve and is not toxic. The collection tank/collector assembly 22 is coupled with the machine manifold 15 of the resist coater 17 at gasket 26. Gasket 26 may be comprised of the same material as gasket 27. Clamps are utilized to form an air tight seal between the manifold 13 and the collection tank/collector 22. These clamps will be more fully described in connection with FIG. 7.

When the resist coater is started, solvent drains into the collection system through resist drains 21. At the same time, forced air may enter the system through these openings 21. An exhaust hole 23 is provided to allow exhaust to escape from the system into the exhaust manifold 13. In the preferred embodiment, an exhaust fan (not shown) is also provided to further remove exhaust from the system. As solvent drains into the system, if flows down the sides 29 of the collector and into the stem 32 until it reaches the collection tank 22 at area 25. The solvent continues to collect in the collection tank 22 until it builds up above the bottom of the stem 32 and reaches the bottom of the main drain hole 31.

As the solvent reaches the main drain hole 31 it is allowed to flow into the main drain system and is disposed of. After the initial installation of the collection tank 22 the solvent never falls below the bottom of the stem 32 of the collector 24. This ensures that the only part of the solvent/resist mixture in the system that is exposed to the exhaust is that which is contained in the stem of the collector. When the exhaust to the spin chambers is turned on, the solvent in the tank will rise up the stems until the level of the liquid 34 in the stem balances with the exhaust pull in the system and the system is in equilibrium. This is due to suction built up by the exhaust system. The result is minimized build up of dried resist on the walls of the tank 22. In fact, resist build up is confined to the slopes 29 of the collector 24 and the machine manifold 15.

To determine the length of the stems in the collectors, it is first determined what the pull up on a column of water by the exhaust on the tank would be. A formula is then used to determined the minimum length of the stem in the collector. This formula, density of water multiplied by length of the water column equals density of the solvent multiplied by length of the solvent column is used to determine minimal length of the stem. Therefore, the length of the solvent column is equal to the density of water multiplied by the length of the water column caused by the pull up of the exhaust on the tank divided by the density of the solvent to be stored in the tank. In the preferred embodiment, the exhaust on the tank is capable of pulling up approximately a 4 inch column of water. The density of the solvent is approximately 0.7 grams per cubic centimeter. Therefore, the minimum length of the stem in the preferred embodiment is 4.0 divided by 0.7 equals 5.2 inches. In the preferred embodiment an excess length for a margin of safety of 1.8 inches is added and the thickness of the silicon gasket, $\frac{1}{8}$ of an inch, is added to the length of the collector stem making the total length of collector stem in the preferred embodiment $7\frac{1}{8}$ inches.

FIG. 3 illustrates the collection tank of the present invention coupled with a resist coater. The spin chamber 20 of the resist coater may contain a wafer and resist from the wafer may drain through the resist drains 21 into the collection tank 22.

Figure 5A:
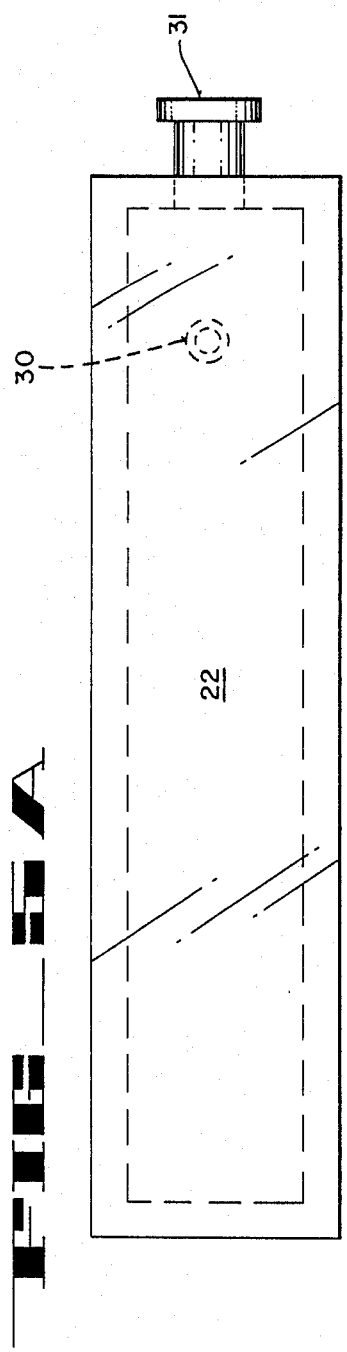
FIG. 5(a) illustrates a top view of the collection tank as may be utilized by the present invention.
Figure 5B:
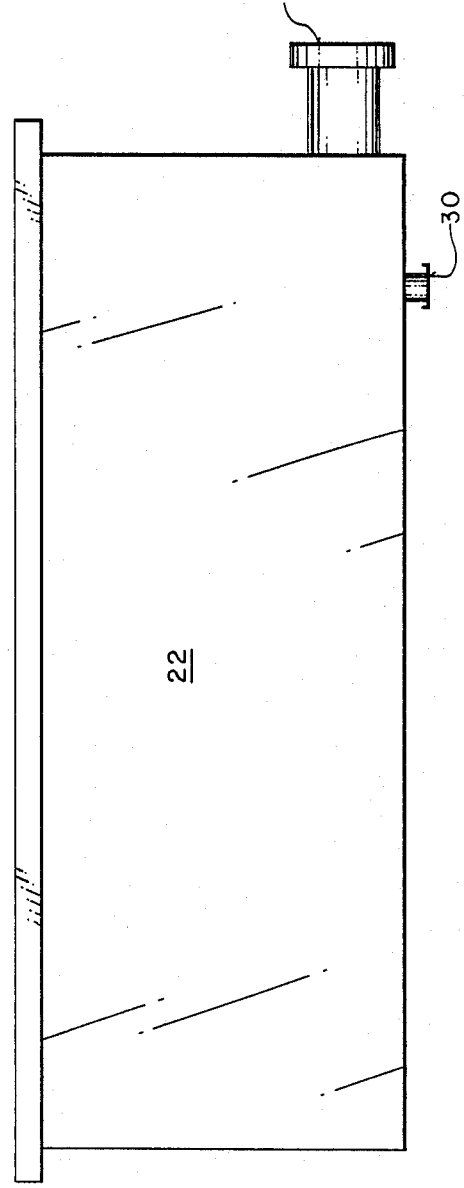
FIG. 5(b) illustrates a side view of the collection tank as may be utilized by the present invention.

FIG. 5(a) illustrates a top view of a collection tank 22 as may be utilized by the present invention. In the preferred embodiment the collection tank is approximately 27 inches long and $6\frac{1}{2}$ inches wide and is comprised of 12 gauge stainless steel. At one end of the collection tank 22 is a flange 31 which may be coupled with the main drain system. At the bottom of the collection tank 22 is a drain port 30 which may be utilized for cleaning of the tank. The drain port 30 is normally closed during operation of the resist coater. FIGS. 5(b) and 5(c) are illustrative of a side view and an end view, respectively, of the collection tank 22. In the preferred embodiment, the collection tank 22 is approximately 8 inches high and the flange 31 is approximately $1\frac{1}{4}$ inches in diameter.

FIG. 6(a) is illustrative of a top view of a collector 24 as may be utilized by the present invention. The collector 24 is comprised of 12 gauge stainless steel and is approximately 27 inches long by $6\frac{1}{2}$ inches wide. In the preferred embodiment, there are three separate collector funnels each measuring approximately $8.083 \times 4.25$ inches. In the center of each collection funnel is a stem which is approximately $1\frac{1}{2}$ inches in diameter. FIGS. 6(b) and 6(c) are illustrative of a side view and an end view, respectively, of the collector of the present invention respectively. The stems 32 in the preferred embodiment measure approximately 7.125 inches in length.

FIG. 7 illustrates a clamp which may be utilized for clamping the collection system of the present invention to the manifold of the resist coater. The clamp comprises a metal U-shaped apparatus through which two nuts 41 are mounted. Screws 42 are provided for securing the collection tank 22 to the machine manifold 15 of the resist coater 17. In the preferred embodiment, the screws 42 have a pin 46 for ease of turning the screw 42 when attaching the collection tank 22 to the machine manifold 15. The screws 42 also have pointed ends 43 for coupling with the collection tank. The screws are approximately 4.375 inches long. The arms 40 of the U-shaped apparatus are pivoted at 47 by means of cotters that allow the arms 40 to swing apart or be entirely disconnected when installing the tank.

Referring again to FIG. 3, the clamp 40 is illustrated attached to the machine manifold 15 and coupled with the collection tank 22. In the preferred embodiment three clamps 40 are used to attach the collection tank 22 to the machine manifold 15.

An alternative to the preferred embodiment may utilize a ptrap in the connection with the main drain system in place of the collection tank. The stem of the collector would couple directly with the p-trap. The p-trap would insure the solvent level in the stem of the collector never completely drains, functioning much the same as the collection tank and drain hole.

Thus, a system for collecting and draining resist and other solvents is disclosed.

I claim:

1. A drain system for collecting and draining liquid during a manufacturing process, comprising:
   a collection tank;
   a collector coupled with said collection tank for collecting said liquid;
   said collector comprising a funnel and a stem;
   said stem further comprising an opening into said collection tank;

said collection tank having a first drain for draining said liquid from said collection tank;

said first drain located on said collection tank, and above a plane perpendicular to said opening of said stem, 2. A drain system, as recited by claim 1, wherein said drain system further comprises;

an exhaust system for removing exhaust from said collection system;

a means coupled with said exhaust system for pulling up a column of said liquid to the top of said stem, 3. A drain system, as recited in claim 2, wherein said collection tank is comprised of stainless steel.

4. A drain system, as recited in claim 3, wherein said collector is comprised of stainless steel.

5. A drain system, as recited in claim 4, wherein said collector is coupled to a first gasket for coupling with a machine utilized in said manufacturing process.

6. A drain system, as recited in claim 5, wherein said collection tank is coupled with a second gasket for coupling with said collector.

7. A drain system, as recited in claim 6, further comprising a plurality of clamps, wherein said clamps are positioned such that said collection tank and said collector can be secured to said machine.

8. In a liquid collection and draining system having a machine manifold having openings for draining liquid and further having an exhaust system for removing exhaust from said collection and draining system, the improvement comprising:

a collection tank for holding the liquid;

a collector coupled with said collection tank and with the machine manifold for collecting the liquid;

said collector having a stem for draining the liquid into said collection tank;

said stem further comprising an opening into said collection tank;

said drain located on said collection tank, and above a plane perpendicular to said opening of said stem 9. A draining system having a machine manifold, as recited by claim 8, wherein said drain is coupled with a main drain system.

10. A draining system having a machine manifold, as recited in claim 9, wherein said collector is comprised of stainless steel.

11. A draining system having a machine manifold, as recited in claim 10, wherein said collection tank further comprises a gasket coupled with said collector.

12. A draining system having a machine manifold, as recited in claim 10, further comprising a plurality of clamps clamping said collection tank and said collector to the machine manifold.

13. A draining system having a machine manifold, as recited in claim 9, wherein said collection tank is comprised of stainless steel.

14. A draining system having a machine manifold, as recited in claim 13, wherein said collector further comprises gasket coupled with said machine manifold.

15. A draining system having a machine manifold, as recited by claim 14, wherein said machine is a resist coater.

* * * * *